United States Patent [19]

Yoshinaga et al.

[11] Patent Number: 5,240,795
[45] Date of Patent: Aug. 31, 1993

[54] VOLUME PHASE TYPE HOLOGRAM FILM AND PHOTOSENSITIVE RESIN COMPOSITION EMPLOYED THEREFOR

[75] Inventors: Yoko Yoshinaga, Machida; Nobuo Kushibiki, Yamato; Tetsuro Kuwayama, Yokohama; Naosato Taniguchi; Hiroyoshi Kishi, both of Atsugi, all of Japan

[73] Assignee: Canon Kabushiki Kaisha, Tokyo, Japan

[21] Appl. No.: 8,840

[22] Filed: Jan. 25, 1993

Related U.S. Application Data

[62] Division of Ser. No. 375,476, Jul. 5, 1989, abandoned.

[30] Foreign Application Priority Data

| Jul. 4, 1988 [JP] | Japan | 63-165085 |
| Jul. 4, 1988 [JP] | Japan | 63-165088 |
| Jul. 4, 1988 [JP] | Japan | 63-165089 |

[51] Int. Cl.⁵ .................................................... G03H 1/02
[52] U.S. Cl. .......................................... 430/1; 430/2; 430/290; 359/1; 359/3
[58] Field of Search ................... 430/1, 2, 290; 359/1, 359/3

[56] References Cited

U.S. PATENT DOCUMENTS

| 3,887,369 | 6/1975 | Matsuno et al. | 430/86 |
| 4,201,441 | 5/1980 | Matsumoto et al. | 430/2 |
| 4,258,111 | 3/1981 | Matsumoto et al. | 430/2 |
| 4,348,472 | 9/1982 | Jagt | 430/270 |
| 4,465,768 | 8/1984 | Ueno et al. | 430/195 |
| 4,517,266 | 5/1985 | Ikegami et al. | 430/2 |
| 4,871,411 | 10/1989 | Kushibiki et al. | 430/1 |
| 4,908,285 | 3/1990 | Kushibiki et al. | 430/1 |
| 4,946,533 | 8/1990 | Kushibiki et al. | 430/1 |
| 5,026,618 | 6/1991 | Kushibiki et al. | 430/1 |

OTHER PUBLICATIONS

Patent Abstracts of Japan, vol. 7, No. 32 (P-174), JP-5-6-69861, [1177], Feb. 8, 1983.
Patent Abstracts of Japan, vol. 11, No 164 (P-580), JP-61-295548, [2611], May 27, 1987.

*Primary Examiner*—Charles L. Bowers, Jr.
*Assistant Examiner*—Martin J. Angebrannt
*Attorney, Agent, or Firm*—Fitzpatrick, Cella, Harper & Scinto

[57] ABSTRACT

A volume phase type hologram film has a diffraction grating recorded in a film composed mainly of poly(N-vinylcarbazole). The poly(N-vinylcarbazole) as the main component has a weight-average molecular weight of not less than 1,000,000 and a molecular weight distribution of not more than 3. In the poly(N-vinylcarbazole), the content of a fraction of poly(N-vinylcarbazole) having a weight-average molecular weight of not more than 200,000 does not exceed 1% by weight.

13 Claims, 3 Drawing Sheets

VOLUME PHASE TYPE HOLOGRAM FILM AND PHOTOSENSITIVE RESIN COMPOSITION EMPLOYED THEREFOR

This application is a division, of application Ser. No. 07/375,476 filed Jul. 5, 1989, now abandoned.

BACKGROUND OF THE INVENTION

1. Field of the Invention

The present invention relates to a volume phase type hologram, particularly to a volume phase type hologram in the form of a film, and a photosensitive resin composition employed therefor.

2. Related Background Art

Gelatin sensitized by a dichromate has hitherto been widely known and employed for recording medium for volume phase type hologram. Other kinds of recording mediums are also known for forming volume phase type hologram comprising a hydrophobic polymer, exemplified by poly(N-vinylcarbazole), (hereinafter referred to as PVCz) sensitized by addition of an iodine compound, which are disclosed in detail in prior art publications such as U.S. Pat. No. 4,172,724, U.S. Pat. No. 4,258,111 and U.S. Pat. No. 4,287,277.

The volume phase type hologram is employed for recording the interference wave of laser beams in a thin film of 20 μm thick or less. In use with a visible light laser, the layer of photosensitive material for hologram recording is required to be fixed with accuracy of approximately from 0.01 to 0.02 μm during exposure in order to record a Bragg's lattice of approximately 0.1 to 0.2 μm interstice within a film.

In after-treatment subsequent to the exposure, the photosensitive recording layer is swelled and then shrinked to modulate the refractive index of the portion recorded by a laser beam, where the recording layer has to be swelled and then shrinked only in a direction substantially perpendicular to the recording layer. Because of such restriction both in light exposure and in after-treatment, conventional volume phase type holograms have been tightly fixed and supported on a rigid substrate plate.

With the development of holography technology, application for the hologram itself are expanding not only in the conventional optical parts such as laser-protecting goggles, head-up display devices, but also in various fields typically amusement of stereopicture itself, ornament of articles, etc. Accordingly, various kinds of volume phase type hologram are required for the application fields.

On the other hand, the aforementioned recording mediums for the volume phase type hologram are not able to satisfy the properties of hologram proposed by the expanding application.

SUMMARY OF THE INVENTION

The present invention is accomplished to reply to such various demands from expansion of the application fields of hologram, and intended to provide a technology facilitating the various applications of a hologram.

An object of the present invention is to provide a hologram film having sufficient strength of film itself.

Another object of the present invention is to provide a photosensitive resin composition which can be easily applied to coating process and preserved while maintaining the characteristics of hologram recording material.

According to an aspect of the present invention, there is provided a volume phase type hologram film having a diffraction grating recorded in a film mainly composed of poly(N-vinylcarbazole), said poly(N-vinylcarbazole) as the main component having a weight-average molecular weight of not less than 1,000,000 and a molecular weight distribution of not more than 3.

According to another aspect of the present invention, there is provided a volume phase type hologram film having a diffraction grating recorded in a film mainly composed of poly(N-vinylcarbazole), said poly(N-vinylcarbazole) containing a fraction of molecular-weight distribution of not more than 2 and weight-average molecular weight of not more than 200,000 with a content of 1% by weight or less, and containing a fraction of weight-average molecular weight of not less than 1,000,000 with a content of 50 weight % or more based on the whole poly(N-vinylcarbazole.

According to still another aspect of the present invention, there is provided a photosensitive resin composition mainly composed of poly(N-vinylcarbazole) with a photosensitive element, said poly(N-vinylcarbazole) comprising as the main component a poly(N-vinylcarbazole) having a weight-average molecular weight of not less than 1,000,000 and a molecular weight distribution of not more than 3.

According to a further aspect of the present invention, there is provided a photosensitive resin composition mainly composed of poly(N-vinylcarbazole) with a photosensitive element, said poly(N-vinylcarbazole) as the main component containing not more than 1% by weight of a fraction having a molecular-weight distribution of not more than 2 and a molecular weight of 200,000, and containing not less than 50% by weight of a fraction having a molecular weight of not less than 1,000,000 based on the whole poly(N-vinylcarbazole).

DETAILED DESCRIPTION OF THE PREFERRED EMBODIMENT

Figure 1:
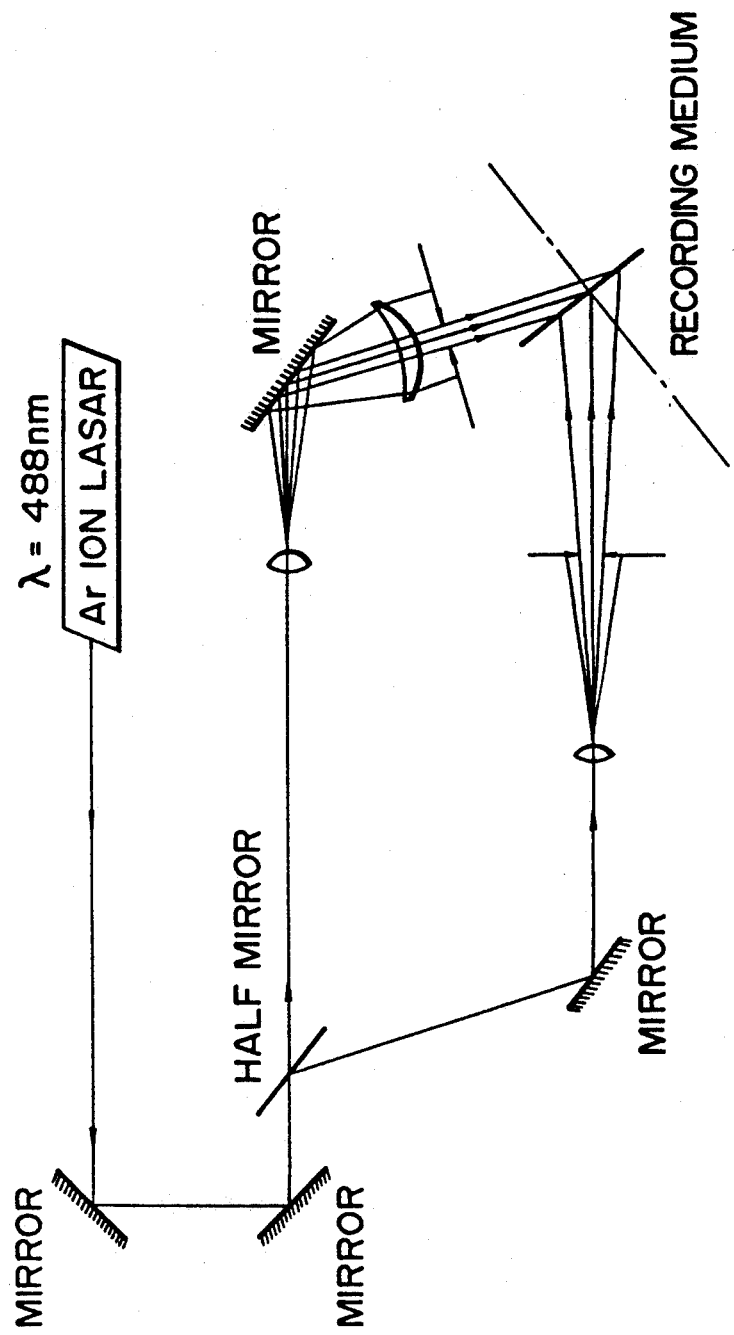
FIG. 1 is a rough sketch showing the exposing optical system used in the Examples and Comparative Examples of the present invention.

The polymeric carrier constituting the volume phase type hologram film of the present invention is the PVCz prepared in the manner mentioned below. The PVCz used in the present invention has a molecular weight of 1,000,000 or more and a molecular-weight distribution of not more than 3. The use of such PVCz as the main constituent gives a volume phase type hologram film which has excellent characteristics such as high diffraction efficiency, high transmissivity, low haze, prevention of shift of diffraction peak wavelength, etc.

On the contrary, commercial PVCz which have been used for preparation of hologram has a weight-average molecular weight of 700,000 to 950,000 as a polystyrene calibration value, and molecular-weight distribution of the range of 4.5 to 5.5. Because of such weight-average molecular weight and molecular-weight distribution, commercial PVCz could not afford not only a film with sufficient mechanical strength for supporting itself but also volume phase hologram with optical properties.

PVCz is generally prepared by polymerization of N-vinylcarbazole. The PVCz prepared in a conventional procedure or purchased from the market have the above-mentioned weight-average molecular weight and molecular-weight distribution. The PVCz having the specified weight-average molecular weight and molecular-weight distribution for the present invention required further purification of commercial PVCz such as fractionation by means of a solvent to remove low molecular weight fractions.

The weight-average molecular weight described in this specification are measured by a gel permeation chromatography in tetrahydrofuran as a polystyrene calibration value at column temperature of 27° C. The columns used were successive combinations of Shodex KF-807 and KF80M, in accordance with polystyrene calibration using standard polystyrene of from $2 \times 10^7$ to $1.2 \times 10^3$ of average molecular weight.

The solvent used in molecular-weight fractionation to obtain the purified PVCz available to the present invention is particularly preferably a mixed solvent of dioxane or pyridine with isopropyl alcohol. Such mixed solvent systems are well adapted to purification of PVCz from point view of fractionation performance, operation temperature, etc., and in particular, a dioxane/isopropyl alcohol system is appreciated at the standpoint of odor toxicity and the like.

The range of the molecular weight and the molecular weight distribution of the fractionated PVCz will be controlled by adjusting the mixing ratio of the good solvent for PVCz to the poor solvent for it therefor.

To explain in more detail, taking for example the dioxane/isopropyl alcohol system, its volume ratio of 100 vs. 20-50 is suitable to the present invention. The concentration of PVCz in mixed solution 10% (weight/volume) or less, preferably 5% (weight/volume) or less depending on the mixing ratio of the solvents. When the concentration of PVCz is beyond 10% (weight/volume), higher fraction of PVCz cannot easily be precipitated, therefore, fractionation efficiency becomes low. On the other hand, fractionation of low concentration of PVCz is undoubtedly uneconomical. The PVCz can be dissolved in the solvent by heating the solvent to a temperature of from 50° C. to the boiling point, any insoluble matter is filtered off, and then the solution is cooled to an appropriate temperature to precipitate a high molecular weight fraction. The PVCz of low molecular weight fraction still remains in the solution, thus giving PVCz having the desired molecular weight and the molecular-weight distribution by solid-liquid separation.

Thus PVCz of a weight-average molecular weight of 1,000,000 or more is obtained. By such operation, with change of the kind of the solvents and the mixing ratio. The PCVz of less low molecular weight PVCz and narrower molecular-weight distribution can be obtained by changing the kind of solvent at a constant ratio of mixture or the mixing ratio of them at the same solvent system.

The comprehensive study by the present inventors reveals that a hologram film having sufficient strength is obtained from a purified PVCz having a weight-average molecular weight of 1,000,000 or more and molecular-weight distribution of 3 or less. In particular, those having a molecular-weight distribution of 2 or less, those containing PVCz of weight-average molecular weight of 2000,000 or less at a content of not more than 1% by weight, and those containing PVCz having a weight-average molecular weight of 1,000,000 at a proportion of 50% by weight of the whole polymer will accomplish more advantageously the object of the present invention.

The above-mentioned PVCz has no light absorption band at the longer wavelength region than 400 nm, so it is required to be made sensitive to radiation beam of ordinary visible region by adding a halogen compound, preferably an iodine compound and/or a bromine compound as a photosensitizer.

The halogen compounds act as a good sensitizer toward PVCz for visible light region. Specifically the preferable carbon-halogen compounds containing iodine bromine such as carbon tetraiodide, iodoform, tetraiodoethylene, triiodoethane, tetraiodoethane, pentaiodoethane, hexaiodioethane, carbon tetrabromide, and tetrabromoethylene. The halogen compound is added in an amount of 100 to 1 parts by weight per 100 parts by weight of the aforementioned PVCz.

Adding too small amount of the halogen compound is not favorable because it lowers the sensitivity of the recording medium and prolongs the required exposure time, while adding too large amount of the halogen compound is unfavorable because it may cause voids in the resulting hologram film after development of hologram.

Use of a plasticizer is not preferable to the preparation of the recording medium of the present invention. If a plasticizer is mixed therein, the plasticizer will dissolve out during development process, but unextracted plasticizer presumably will give inhomogeneous refractive index in the PVCz film except the modulation of refraction index that satisfies the Bragg condition in the recording medium after shrinkage. However, the use is not necessary prohibited within the range where such inconvenience does not arise.

The volume phase type hologram film of the present invention is prepared by dissolving the above-mentioned PVCz and sensitizer in a suitable solvent to form a photosensitive liquid, adjusting the viscosity thereof if necessary, applying and drying the liquid on a flat substrate such as a glass plate or a plastic film to form a coating film as a recording medium, subjecting it to successive procedure of light exposure and image development, and peeling it.

The photosensitive resin composition suitable for preparation of the volume phase type hologram film of the present invention is obtained by dissolving the above-mentioned purified and adjusted PVCz together with a sensitizer and optionally stabilizer in a good solvent. The viscosity of the resulting solution is adjusted to be within the range of from 50 to 5,000 cps, preferably from 300 to 2,000 cps at 20° C. The ratio of the amount of the PVCz to be added to the organic solvent is preferably about 2 to 14 g per 100 ml of the organic solvent. The viscosity of not more than 2,000 cps is preferable from the view point of coating characteristics, so that the solution of higher viscosity is preferably diluted with a suitable solvent to reduce the viscosity prior to the coating.

The use of a high boiling organic solvent is not preferable, because it evaporates slowly in formation of the film and the evaporation requires a high temperature and in some cases foams are generated in the film. Therefore, an organic solvent having a boiling point of about 50° to 150° C. is preferably selected.

The preferable organic solvents for PVCz includes benzene, xylene, chlorobenzene, chloroform, dichloroethane, dichloroethylene, trichloroethylene, pyridine, dioxane, tetrahydrofuran, and their mixtures in consideration of the solubility for PVCz and the boiling point.

The dissolution of PVCz may be conducted by a conventional dissolving method such as putting the PVCz in an organic solvent and optionally heating it, removing insoluble matter by filtration, and leaving it standing to remove bubbles, but the procedure is not limited thereto.

The stabilizer to be added to the above-mentioned solution serves to retard the reaction of PVCz in the solution and to prevent viscosity increase of the solution. In the present invention, used are, for example, N-vinylcarbazole and its alkyl-substituted derivatives and its halogen-substituted derivatives: specifically, 3-chlorovinylcarbazole, 3-bromovinylcarbazole, 3-iodovinylcarbazole, 3-methylvinylcarbazole, 3methylvinylcarbazole, 3-ethylvinylcarbazole, etc.

Additionally, any known stabilizers may be used including benzophenone type, quinone type, hydroquinone type, and diphenylpicrylhydrazyl type: specifically, benzphenone, quinone, hydroquinone, thiobenzophenone, fluoranil, chloranil, bromanil, dichlorodicyanoquinone, diphenylpicrylhydrazyl, etc.

The adding content of the stabilizer depends upon the kind of stabilizer and thus cannot be specified unconditionally. However, adding content is generally in the range of from 10 to 0.01 mol, preferably 2 to 0.1 mol per 1 mol of the sensitizer. The use of the more stabilizer exceeding the above-mentioned range will lower the sensitivity of the recording medium formed from the photosensitive liquid, while the use of excessively small amount thereof will lead to insufficient retardation of viscosity increase, which unpreferably make film formation difficult and degrades the quality of the hologram.

The recording medium comprising the photosensitive resin composition of the present invention is obtained through the steps of adjusting the viscosity of the above-mentioned photosensitive composition to an appropriate level, and coating with it a suitable substrate such as a glass plate and a plastic film. The thickness of the coating film (dry thickness) is preferably within the range of from 5 $\mu$m to 15 $\mu$m, which depends upon intended optical characteristics of the resulting hologram, and strength of the hologram. The film thickness is restricted also by the band width of the diffraction peak, because there is a theoretical suggestion regarding the relation of the film thickness and the band width of diffraction peak.

The recording medium thus formed is exposed to two interfering laser beams of coherent visible light of wavelength up to 560 nm by means of an optical system as shown in FIG. 1.

Subsequently to the exposure, the recording medium is immersed in a solvent which hardly extract PVCz constituting the recording layer as well as crosslinked PVCz formed by photoreaction.

The succeeding development process comprises two steps of swelling and shrinking.

The recording layer carrying a latent hologram image formed by the aforementioned light exposure and having made free from the halogen compound is treated with a first solvent to cause the recording layer to swell in correspondence with the given hologram pattern. In the next treatment with a second solvent, the recording layer in a swollen state is made to shrink to amplify and fix the hologram corresponding to the swollen state.

The first solvent in the hologram developing step is the one which dissolves out within a short time neither the uncrosslinked PVCz nor crosslinked PVCz after the photoreaction between the PVCz and the halogen compound. Such solvent or combination of solvents are chosen which have suitable swelling power.

The second solvent to cause the recording layer to shrink may be any solvent which does not swell nor dissolve the recording layer and is compatible with the above-mentioned first solvent. The second solvent or the solvent combination is chosen from non- or poor solvents for PVCz.

The treating conditions such as temperature of solvent and immersing time length of each of the steps depend on the kind of recording layer or the solvent, etc., and cannot simply be specified. Generally, in each step the treatment is sufficient at a temperature of 10°–70° C. for several seconds to several minutes.

The resulting hologram film can naturally be used together with the substrate attached thereto. It can also be used satisfactorily as a self-supporting hologram film without the substrate for various uses since the PVCz in the present invention has a high molecular weight and has a sufficient strength in a state where the substrate is removed.

The peeling of the hologram film from the substrate may preferably be conducted, for example, in the above-mentioned non-solvent or water which does not dissolve nor swell the hologram film. The hologram has a sufficient strength upon peeling, so that the substrate need not be destroyed, dissolved, or swelled.

The resulting volume phase type hologram of the present invention has a tensile strength of not less than 5N/mm$^2$ at a rate of 500 mm/min in the tensile test by means of a tensile tester according to JIS K7113, and has sufficient strength as single film for fabrication and handling in various uses. If the tensile strength of the film is less than 5N/mm2, the film will be broken or crushed, and the advantage of the present invention cannot be achieved.

The use of PVCz having the specified weight-average molecular weight and the molecular-weight distribution gives the volume phase type hologram which can be treated or fabricated in various manners even if the substrate is peeled off.

The above-mentioned volume phase type hologram exhibits an improved maximum diffraction efficiency up to 99.9%, and has hologram characteristics of transmissivity of 92% at 600 nm, and haze of not more than 2% at 10 $\mu$m thickness.

The use of the photosensitive resin composition of the present invention allows the formation of self-supporting volume phase type hologram having a uniform thickness of from 5 to 15 $\mu$m, preferably 7 to 10 $\mu$m. Even when the photosensitive resin composition is brought into a solution, a recording layer having a uniform film thickness can be formed after a long period of storage since the viscosity increase of the solution liquid is suppressed.

The present invention will be explained below in more detail by employing Examples and Reference examples.

EXAMPLE 1

20 grams of PVCz (Rubican® M-170 made by BASF) was put into 600 ml of a mixed solvent of dioxane/isopropyl alcohol (weight ratio: 3/1), heated to 80°

C. to prepare a homogeneous solution, and then cooled to 25° C.

The precipitated PVCz was separated by decantation, and the separated PVCz was washed several times by agitating with 200 ml portions of dioxane/isopropyl alcohol mixture (weight ratio: 3/1) to obtain purified PVCz.

A portion of the obtained purified PVCz was dissolved in tetrahydrofuran, and tested for weight-average molecular weight and molecular-weight distribution by means of a gel permeation chormatography at 27° C. employing the combination of columns of Shodex KF-807 and KF80M, (made by Showa Denko K. K.), with polystyrene (made by Showa Denko K. K.) as the standard. The results are as follows:

Weight-average molecular weight: 1,520,000
Molecular weight distribution: 1.48
Content of PVCz of molecular weight not higher than 200,000: 0.8% by weight
Content of PVCz of molecular weight not less than 1,000,000: 62% by weight 2.5 grams of this purified PVCz and 0.25 gram of carbon tetraiodide were put into 40 ml of chlorobenzene, and agitated in the dark to dissolve completely, giving a photosensitive liquid.

Immediately thereafter, the photosensitive liquid was applied onto a cleaned glass plate by means of a spinner (made by Kyowa Semiconductor) and dried to form a recording layer of 7.2 μm thick.

The recording layer was subjected to exposure by means of an optical system as illustrated in FIG. 1 employing Ar laser (488 nm) to record hologram thereon.

After the exposure, it was immersed in toluene at 35° C. for 2 minutes, in xylene at 35° C. for 2 minutes, and further in heptane at 20° C. for 2 minutes, and dried to obtain volume phase type hologram.

The reflective diffraction efficiency of the obtained hologram was measured to have maximum reflective diffraction efficiency of 99% for the light of 518 nm. The light transmittance was 87% at 600 nm light wavelength, and the haze (total haze value) was 1.7% by means of a haze meter (made by Nippon Denshoku K.K.) according to JIS K7105.

Subsequently, the above hologram was immersed in water, and the recording layer was peeled from the glass plate and was dried to obtain a volume phase type hologram film. The hologram film was tested for various properties as mentioned above to find no change of the properties.

The hologram film was cut into a long rectangular strip of 75 mm in length and 10 mm in breadth. It was tested for tensile strength at the rate of 500 mm/min by means of Autograph DCS-M (made by Shimadzu Seisakusho Ltd.). The film had a tensile strength at break of 14 N/mm$^2$, and had a sufficient strength for manual handling.

EXAMPLE 2

A volume phase type hologram film of 7.4 μm thick was prepared in the same manner as in Example 1 except that the purified PVCz had a molecular weight of 1,200,000 and molecular weight distribution of 2.8.

The hologram film exhibited the maximum diffraction efficiency of 98% (518 nm) and the transmissivity of 87% (600 nm), and had a strength at break of 11 N/mm$^2$ as measured in the same manner as in Example 1.

EXAMPLE 3

5.2 grams of the purified PVCz, 0.4 gram of carbon tetraiodide, and 0.15 gram of N-vinylcarbazole was added to 120 ml of chlorobenzene, and the mixture was agitated in the dark to become completely dissolved to give a photosensitive resin solution.

Figure 2:
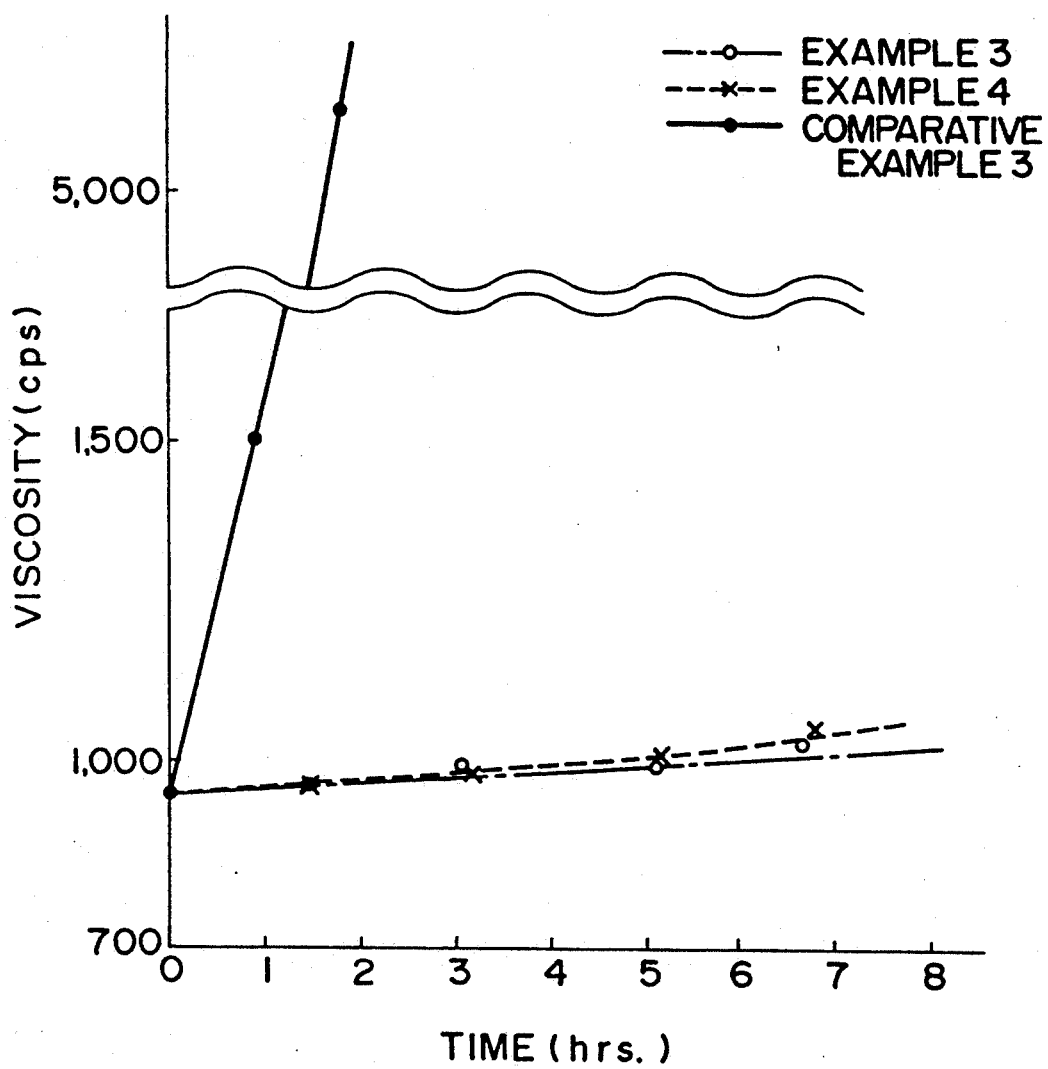
FIG. 2 and FIG. 3 illustrate respectively the change of the viscosity of a PVCz solution as a function of the elapsed time.

The solution was subjected to measurement of viscosity as a function of time at 25° C. by means of E type viscometer (VISCONIC ED, made by Tokyo Keiki Co., Ltd.) with a 3° corn. The results are shown in FIG. 2.

The above-described photosensitive resin solution was agitated and defoamed. After 3.5 hours, it was applied on a cleaned glass plate by a spinner (made by Kyowa Semiconductor K.K.), and dried to form a recording layer of 9.8 μm thick. The uniformity of the thickness of the recording layer was measured by using a mask having a bored hole of 5 mm in diameter and employing monitor wavelength of 350 nm of a spectrophotometer to find that the variation of the thickness was within 0.5 μm.

The recording layer was subjected to exposure by means of an optical system as illustrated in FIG. 1 employing Ar laser (488 nm) to record hologram thereon.

After the exposure, it was immersed in toluene at 35° C. for 2 minutes, in xylene at 35° C. for 2 minutes, and further in heptane at 20° C. for 2 minutes, and dried to obtain volume phase type hologram.

The reflective diffraction efficiency of the obtained hologram was measured to have a maximum reflective diffraction efficiency of 92% for the light of 518 nm. The light transmittance was 85% at 600 nm light wavelength, and the haze (total haze value) was 1.2% by means of a haze meter (made by Nippon Denshoku K.K.) according to JIS K7105.

Subsequently, the above hologram was immersed in water and the recording layer was peeled from the glass plate, and was dried to obtain a volume phase type hologram film. The hologram film was tested for various properties as mentioned above to find no change of the properties.

The hologram film was tested for tensile strength in the same manner as in Example 1. The film had a tensile strength at break of 18 N/mm$^2$, and had a sufficient strength for manual handling.

EXAMPLE 4

A photosensitive resin solution was obtained in the same manner as in Example 3 except that the same amount of N-vinylethylcarbazole in place of N-vinylcarbazole.

The solution was subjected to measurement of viscosity as a function of time at 25 C. by means of E type viscometer (VISCONIC ED, made by Tokyo Keiki Co., Ltd.) with a 3° corn. The results are shown in FIG. 2.

By employing this solution, there were obtained a volume phase type hologram, and further a hologram film peeled from the glass plate in the same manner as in Example 3. All the characteristics are nearly the same as in Example 3.

EXAMPLE 5

30 grams of PVCz (Rubican® M-170 made by BASF) was put into 600 ml of a mixed solvent of dioxane/isopropyl alcohol. (weight ratio: 100/40), heated to 80° C. to prepare a homogeneous solution, and cooled to 25° C.

The precipitated PVCz was separated by decantation, and the separated PVCz was washed by agitating with 200 ml of dioxane/isopropyl alcohol mixture (weight ratio: 100/40) to obtain purified PVCz.

A portion of the resulting purified PVCz was dissolved in tetrahydrofuran, and tested for weight-average molecular weight and molecular-weight distribution by means of gel permeation chormatography at 27° C. employing the combination of columns of Shodex KF-807 and KF80M, (made by Showa Denko K.K.), and polystyrene (made by Showa Denko K.K.) as the standard. The results are as below:

Weight-average molecular weight: 1,430,000
Molecular-weight distribution: 1.73
Content of PVCz of molecular weight not higher than 200,000: 0.3% by weight
Content of PVCz of molecular weight not less than than 1,000,000: 52% by weight 5.2 grams of this purified PVCz, 0.40 gram of carbon tetraiodide, and 0.21 gram of 4,4-tetramethyldiaminothiobezophenone were put into 120 ml of chlorobenzene, and agitated in the dark to become dissolved completely, giving a photosensitive liquid.

Figure 3:
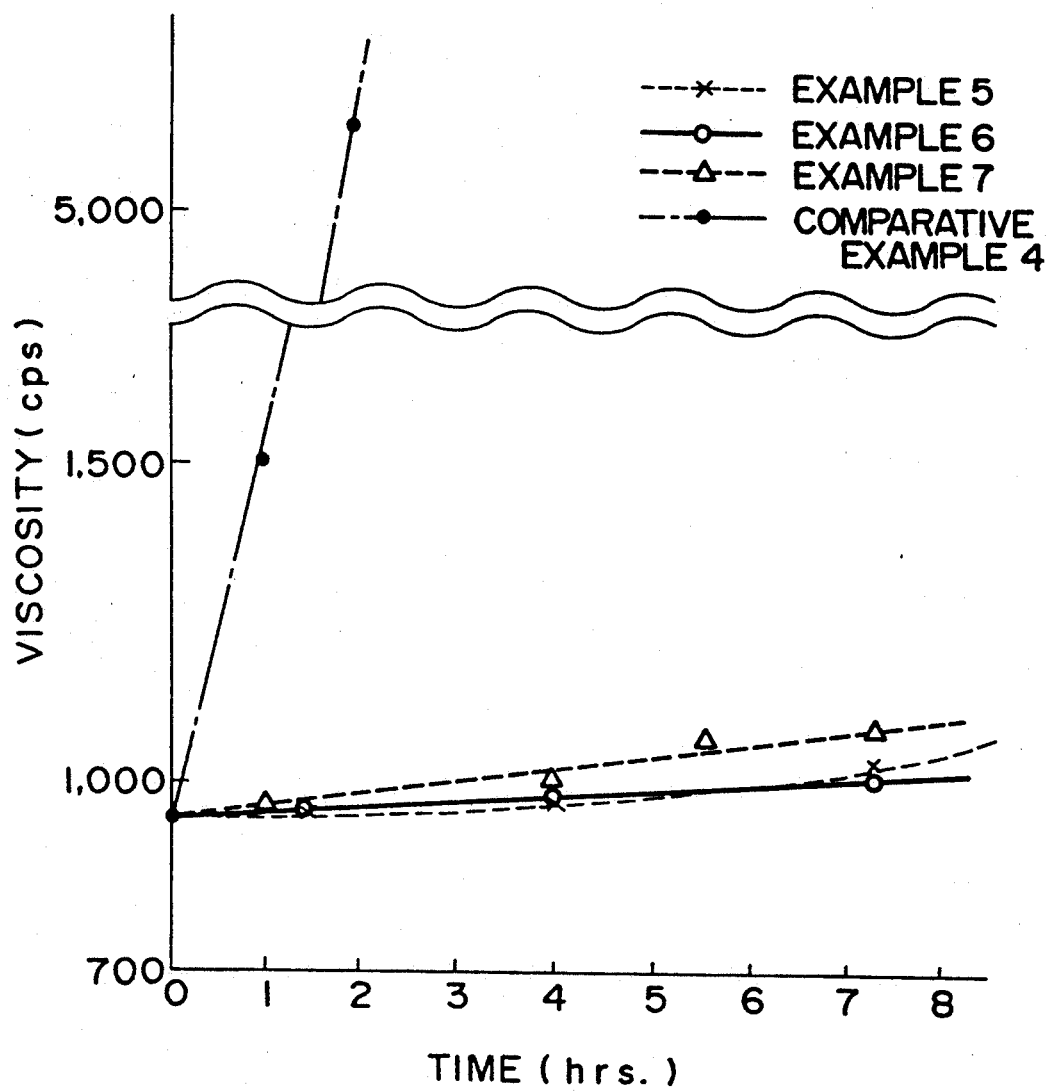

The solution was subjected to measurement of viscosity as a function of time at 25° C. by means of E type viscometer (VISCONIC ED, made by Tokyo Keiki Co., Ltd.) with a 3° corn. The results are shown in FIG. 3.

The above-described photosensitive resin solution was applied on a cleaned glass plate by a spinner (Mikasa 1M), and dried to form a recording layer of 7.2 μm thick. The uniformity of the thickness of the recording layer was measured by using a mask having a bored hole of 5 mm in diameter and employing monitor wavelength of 350 nm of a spectrophotometer to find that the variation of the thickness was within 0.5 μm.

The recording layer was subjected to exposure by means of an optical system as illustrated in FIG. 1 employing Ar laser (488 nm) to record hologram thereon.

After the exposure, it was immersed in toluene at 35° C. for 2 minutes, in xylene at 35° C. for 2 minutes, and further in heptane at 20° C. for 2 minutes, and dried to obtain volume type phase hologram.

The reflective diffraction efficiency of the obtained hologram was measured by means of a reflective spectrophotometer (Hitachi u-3400), and the maximum reflective diffraction efficiency was found to be 99% for the light of 518 nm. The light transmissivity was 87% at 600 nm light wavelength, and the haze (total haze value) was 1.7% by means of a haze meter (made by Nippon Denshoku K.K.) according to JIS K7105.

The characteristics of the hologram was measured after the hologram was kept in nitrogen atmosphere at 140° C. for approximately 5 hours. Thereby no shift of the peak of the maximum diffraction efficiency was observed, and no change was observed at all in the maximum diffraction efficiency and haze value.

Subsequently, the above hologram was immersed in water and the recording layer was peeled off the glass plate, and was dried to obtain a volume type hologram film. The hologram film was tested for various properties as mentioned above to find no change of the properties.

The hologram film was tested for tensile strength in the same manner as in Example 1. The film had a tensile strength at break of 15 N/mm$^2$, and had a sufficient strength for manual handling.

EXAMPLE 6

The purified PVCz as mentioned below was prepared in the same manner as in Example 5 except that the solvent for purification was a dioxane/isopropyl alcohol mixture (weight ratio: 100/30).

Weight-average molecular weight: 1,590,000
Molecular weight distribution: 1.89
Content of PVCz of molecular weight not higher than 200,000: 0.1% by weight
Content of PVCz of molecular weight not less than 1,000,000: 62% by weight 5.2 grams of this purified PVCz, 0.40 gram of carbon tetraiodide, and 0.3 gram of diphenylpicrylhydrazyl were put into 120 ml of chlorobenzene, and agitated in the dark to become completely dissolved to prepare a photosensitive liquid.

The solution was subjected to measurement of viscosity as a function of time at 25° C. by means of E type viscometer (VISCONIC ED, made by Tokyo Keiki Co., Ltd.) with a 3° corn. The results are shown in FIG. 3.

The above-described solution was applied on a cleaned glass plate by a spinner (Mikasa 1M), and dried to form a recording layer of 7.6 μm thick. The uniformity of the thickness of the recording layer was measured by using a mask having a bored hole of 5 mm in diameter and employing monitor wavelength of 350 nm of a spectrophotometer to find that the variation of the thickness was within 0.5 μm.

The recording layer was subjected to exposure by means of an optical system as illustrated in FIG. 1 employing Ar laser (488 nm) to record hologram thereon.

After the exposure, it was immersed in toluene at 35° C. for 2 minutes, in xylene at 35° C. for 2 minutes, and further in heptane at 20° C. for 2 minutes, and dried to obtain volume phase type hologram.

The refractive diffraction efficiency of the obtained hologram was measured by means of a reflective spectrophotometer (Hitachi u-3400), and the maximum efficiency was found to be 99% for the light of 518 nm. The light transmissivity was 87% at 600 nm light wavelength, and the haze (total haze value) was 1.7% by means of a haze meter (made by Nippon Denshoku K.K.) according to JIS K7105.

The characteristics of the hologram was measured after the hologram was kept in nitrogen atmosphere at 140° C. for approximately 5 hours. Thereby no shift of the peak of the maximum diffraction efficiency was observed, and no change was observed at all in the maximum diffraction efficiency and haze value.

Subsequently, the above hologram was immersed in water and the recording layer was peeled from the glass plate, and was dried to obtain a volume phase type hologram film. The hologram film was tested for various properties as mentioned above to find no change of the properties.

The hologram film was tested for tensile strength in the same manner as in Example 1. The film had a tensile strength at break of 14 N/mm$^2$, and had a sufficient strength for manual handling.

EXAMPLE 7

The purified PVCz as mentioned below was prepared in the same manner as in Example 5 except that the solvent for purification was a pyridine/methyl alcohol mixture (weight ratio: 100/70).

Weight-average molecular weight: 1,410,000
Molecular weight distribution: 2.40
Content of PVCz of molecular weight not higher than 200,000: 0.9% by weight
Content of PVCz of molecular weight not less than 1,000,000: 58% by weight 5.2 grams of this purified PVCz, 0.40 gram of carbon tetraiodide, and 0.19 gram of chloranil were put into 120 ml of chlorobenzene, and agitated in the dark to become dissolved completely to prepare a photosensitive liquid.

The solution was subjected to measurement of viscosity as a function of time at 25° C. by means of E type viscometer (VISCONIC ED, made by Tokyo Keiki Co., Ltd.) with a 3° corn. The results are shown in FIG. 3.

The above-described solution was applied on a cleaned glass plate by a spinner (Mikasa 1M), and dried to form a recording layer of 7.2 μm thick. The uniformity of the thickness of the recording layer was measured by using a mask having a bored hole of 5 mm in diameter and employing monitor wavelength of 350 nm of a spectrophotometer to find that the variation of the thickness was within 0.5 μm.

The recording layer was subjected to exposure by means of an optical system as illustrated in FIG. 1 employing Ar laser (488 nm) to record hologram thereon.

After the exposure, it was immersed in toluene at 35° C. for 2 minutes, in xylene at 35° C. for 2 minutes, and further in heptane at 20° C. for 2 minutes, and dried to obtain volume phase type hologram.

The reflective diffraction efficiency of the obtained hologram was measured by means of a reflective spectrophotometer (Hitachi u-3400), and the maximum reflective diffraction efficiency was found to be 99% for the light of 518 nm. The light transmissivity was 87% at 600 nm light wavelength, and the haze (total haze value) was 1.7% by means of a haze meter (made by Nippon Denshoku K.K.) according to JIS K7105.

The characteristics of the hologram was measured after the hologram was kept in nitrogen atmosphere at 140° C. for approximately 5 hours. Thereby no shift of the peak of the maximum diffraction efficiency was observed, and no change was observed at all in the maximum diffraction efficiency and haze value.

Subsequently, the above hologram was immersed in water and the recording layer was peeled off the glass plate, and was dried to obtain a volume type hologram film. The hologram film was tested for various properties as mentioned above to find no change of the properties.

The hologram film was tested for tensile strength in the same manner as in Example 1. The film had a tensile strength at break of 15 N/mm$^2$, and had a sufficient strength for manual handling.

COMPARATIVE EXAMPLE 1

A volume phase type hologram for comparative example was prepared by recording layer formation, exposure, and development in the same manner as in Example 1 except that the PVCz (Rubican M-170) before purification in Example 1 was used and the thickness of the recording layer was made 16 um. The hologram was tested in the same manner as in Example 1. As the result, the diffraction efficiency was as low as only 4%, the transmittance was as low as 68%, and the film was turbid in white which made needless the measurement of haze.

The hologram film had a tensile strength at break of 4.8 N/mm$^2$ according to the tensile test in the same manner as in Example 1, and was fragile.

The above-mentioned unpurified PVCz had a weight-average molecular weight of 920,000 and molecular-weight distribution of 5.4 under the same measurement condition as in Example 1.

COMPARATIVE EXAMPLE 2

A volume type phase hologram film for a comparative example was prepared through recording-layer-formation, exposure, and development in the same manner as in Example 1 except that 2.5 gram of unpurified PVCz (Tubicol 210 SP, made by Anan Koryo K. K.) was used in place of the purified PVCz of Example 1 and the thickness of the recording layer was made 19 μm. This hologram exhibited maximum diffraction efficiency of 23% (520 nm), light-transmittance of 73%, and haze of 21%. The strength was 4.0 N/mm$^2$ according to tensile test similar to that in Example 1. The film was very fragile and tend to be broken.

The unpurified PVCz as measured under the same condition as in Example 1 had a weight-average molecular weight of 780,000 and molecular-weight distribution of 4.6.

COMPARATIVE EXAMPLE 3

A photosensitive resin solution was prepared in the same manner as in Example 3 except that the N-vinylcarbazole was not employed. The viscosity of the solution was similarly measured as a function of time. The results are shown in FIG. 2. The solution having an increased viscosity of 5,000 cps or higher could not easily be made homogeneous even after it was diluted with a solvent, and was not suitable for practical use.

COMPARATIVE EXAMPLE 4

A photosensitive resin solution was prepared in the same manner as in Example 5 except that the 4,4'-tetramethyldiaminothiobenzophenone was not employed. The viscosity of the solution was similarly measured as a function of time. The results are shown in FIG. 3. The solution having an increased viscosity of 5,500 cps or higher could not easily be made homogeneous even after it was diluted with a solvent, and was not suitable for practical use.

We claim:

1. A volume phase hologram film having a diffraction grating recorded in said film comprising a photo-crosslinked poly(N-vinylcarbazole) resin, said resin prior to photo-crosslinking comprising a poly(N-vinylcarbazole) resin having a weight-average molecular weight of not less than 1,000,000 and a molecular weight distribution of not more than 3 and a photosensitizer.

2. The volume phase hologram film of claim 1, wherein the content of a fraction of poly(N-vinylcarbazole) having a weight-average molecular weight of not more than 200,000 in said poly(N-vinylcarbazole) does not exceed 1% by weight.

3. The volume phase hologram film of claim 1, wherein the molecular-weight distribution of said poly(N-vinylcarbazole) is 2 or less.

4. The volume phase hologram film of claim 1, wherein the content of poly(N-vinylcarbazole) having a weight-average molecular weight of not less than 1,000,000 is 50% by weight or more of the whole poly(N-vinylcarbozole).

5. The volume phase hologram film of claim 1, wherein said film has a tensile strength of 5 N/mm² or more according to JIS K7113.

6. The volume phase hologram film of claim 1, said film is supported by a substrate plate.

7. The volume phase hologram film of claim 1, wherein the film has a thickness ranging from 5 μm to 15 μm.

8. The volume phase hologram film of claim 1, wherein said film has a uniform thickness.

9. A volume phase hologram film having a diffraction grating recorded in said film comprising a photo-cross-linked poly(N-vinylcarbazole) resin, said resin prior to photo-crosslinking comprising a poly(N-vinylcarbazole) resin containing not more than 1% by weight of a fraction having a molecular-weight distribution of not more than 2 and a weight-average molecular weight of not more than 200,000, and containing not less than 50% by weight of a fraction having a weight-average molecular weight of not less than 1,000,000 based on the whole poly(N-vinylcarbazole) and a photosensitizer.

10. The volume phase hologram film of claim 9, wherein said film has a tensile strength of 5 N/mm² or more according to JIS K7113.

11. The volume phase hologram film of claim 9, wherein said film is supported by a substrate plate.

12. The volume phase hologram film of claim 9, wherein the film has a thickness ranging from 5 μm to 15 μm.

13. The volume phase hologram film of claim 9, wherein said film has a uniform thickness.

* * * * *

UNITED STATES PATENT AND TRADEMARK OFFICE
CERTIFICATE OF CORRECTION

PATENT NO. : 5,240,795

DATED : August 31, 1993

INVENTOR(S) : YOKO YOSHINAGA, ET AL.

Page 1 of 3

It is certified that error appears in the above-identified patent and that said Letters Patent is hereby corrected as shown below:

IN THE DRAWINGS,
SHEET 1 OF 3

FIG. 1, "LASAR" should read --LASER--.

COLUMN 1

Line 29, "halogram" should read --hologram--.
Line 45, "application" should read --applications--.
Line 48, "amusement of" should read --the use of the--.

COLUMN 2

Line 18, "poly(N-vinylcarbazole." should read --poly(N-vinylcarbazole).--.
Line 64, "could not afford not only" should read --does not only not provide--.

COLUMN 3

Line 24, "at" should read --from--.
Line 33, "solution" should read --solution is--.
Line 51, "obtained. By" should read --obtained by--.
Line 56, "of them at" should read --of them in--.

COLUMN 4

Line 12, "such as" should read --are, for example--.
Line 14, "hexaiodioethane" should read --hexaiodoethane--.

UNITED STATES PATENT AND TRADEMARK OFFICE
CERTIFICATE OF CORRECTION

PATENT NO. : 5,240,795
DATED : August 31, 1993
INVENTOR(S) : YOKO YOSHINAGA, ET AL.

It is certified that error appears in the above-identified patent and that said Letters Patent is hereby corrected as shown below:

COLUMN 5

Line 16, "3methyl-" should be deleted.
Line 17, "vinylcarbazole," should be deleted.
Line 21, "benzphenone," should read --benzophenone--.
Line 28, "of the more" should read --of more--.
Line 55, "Subsequently" should read --Subsequent--.
Line 63, "having made free" should read --having been made free--.

COLUMN 8

Line 55, "25 C." should read --25°C.--.

COLUMN 9

Line 10, "chormatography" should read --chromatography--.
Line 45, "type phase" should read --phase type--.

COLUMN 11

Line 50, "volume type" should read --volume phase type--.

COLUMN 13

Line 2, "(N-vinylcarbozole)." should read --(N-vinylcarbazole).--.

UNITED STATES PATENT AND TRADEMARK OFFICE
CERTIFICATE OF CORRECTION

PATENT NO. : 5,240,795
DATED : August 31, 1993
INVENTOR(S) : YOKO YOSHINAGA, ET AL.

It is certified that error appears in the above-identified patent and that said Letters Patent is hereby corrected as shown below:

COLUMN 13

Line 6, "claim 1," should read --claim 1, wherein--.

Signed and Sealed this

Tenth Day of May, 1994

Attest:

BRUCE LEHMAN

Attesting Officer   Commissioner of Patents and Trademarks